United States Patent
Kapoor et al.

(10) Patent No.: US 6,458,722 B1
(45) Date of Patent: Oct. 1, 2002

(54) CONTROLLED METHOD OF SILICON-RICH OXIDE DEPOSITION USING HDP-CVD

(75) Inventors: Bikram Kapoor, San Jose, CA (US); Kent Rossman, Orlando, FL (US)

(73) Assignee: Applied Materials, Inc., Santa Clara, CA (US)

( * ) Notice: Subject to any disclaimer, the term of this patent is extended or adjusted under 35 U.S.C. 154(b) by 56 days.

(21) Appl. No.: 09/697,380

(22) Filed: Oct. 25, 2000

(51) Int. Cl.$^7$ .................. H01L 21/31; H01L 21/469
(52) U.S. Cl. .................. 438/788; 438/790; 118/723
(58) Field of Search ................. 438/681, 787, 438/789, 790, 788; 118/697, 723

(56) References Cited

U.S. PATENT DOCUMENTS

| | | | |
|---|---|---|---|
| 5,670,224 A | 9/1997 | Izu et al. | 428/35.8 |
| 6,030,666 A | 2/2000 | Lam et al. | 427/539 |
| 6,211,035 B1 * | 4/2001 | Moise et al. | 438/396 |
| 6,217,658 B1 * | 4/2001 | Orczyk et al. | 118/723 |
| 6,218,320 B1 * | 4/2001 | Lu et al. | 438/788 |
| 6,313,010 B1 * | 11/2001 | Nag et al. | 438/435 |
| 2001/0040091 A1 * | 11/2001 | Khurana et al. | 204/298.34 |

FOREIGN PATENT DOCUMENTS

| | | |
|---|---|---|
| EP | 1 100 119 A1 | 5/2001 |
| JP | 11 031599 | 2/1999 |
| WO | WO 99/36955 | 7/1999 |
| WO | WO00/01007 | 1/2001 |

OTHER PUBLICATIONS

U.S. patent application Ser. No. 09/470,819, Khazeni et al., filed Dec. 23, 1999.

* cited by examiner

Primary Examiner—Caridad Everhart
(74) Attorney, Agent, or Firm—Townsend & Townsend and Crew, LLP

(57) ABSTRACT

A method and system for forming a layer on a substrate in a process chamber are provided. Deposition gases are provided to the process chamber and permitted to mix in the desired relative concentrations prior to the deposition step, resulting in improved composition uniformity of the layer. This may be accomplished by generating a heating plasma from a first gaseous mixture. The plasma is then terminated and a second gaseous mixture is provided to the process chamber such that the second gaseous mixture is substantially uniformly mixed. A second plasma is then generated from the second gaseous mixture to deposit the layer on the substrate.

21 Claims, 6 Drawing Sheets

CONTROLLED METHOD OF SILICON-RICH OXIDE DEPOSITION USING HDP-CVD

BACKGROUND OF THE INVENTION

The present invention relates to the manufacture of integrated circuits on a substrate. More particularly, the invention relates to a method and apparatus for improved plasma deposition of layers on substrates.

One of the primary steps in the fabrication of modem semiconductor devices is the formation of a thin layer on a semiconductor substrate by chemical reaction of gases. Such a deposition process is referred to generally as chemical-vapor deposition ("CVD"). Conventional thermal CVD processes supply reactive gases to the substrate surface where heat-induced chemical reactions take place to produce a desired layer. Plasma-enhanced CVD ("PECVD") techniques, on the other hand, promote excitation and/or dissociation of the reactant gases by the application of radio-frequency ("RF") energy to a reaction zone near the substrate surface, thereby creating a plasma. The high reactivity of the species in the plasma reduces the energy required for a chemical reaction to take place, and thus lowers the temperature required for such CVD processes as compared to conventional thermal CVD processes. These advantages are further exploited by high-density-plasma ("HDP") CVD techniques, in which a dense plasma is formed at low vacuum pressures so that the plasma species are even more reactive. "High-density" is understood in this context to mean having an ion density that is equal to or exceeds $10^{11}$ ions/cm$^3$.

Particular applications that lend themselves to effective use of HDP-CVD techniques include shallow-trench isolation ("STI"), premetal dielectric ("PMD") applications, and intermetal dielectric ("IMD") applications. One issue that affects deposition properties in various such applications is diffusion between adjoining layers that have different compositions, which can adversely affect certain desired properties of the resulting layer structure. One approach that has been used to prevent such diffusion includes deposition of an additional intermediate barrier layer. For example, when doped silicon oxide is deposited in IMD applications, diffusion of the dopant to metal lines may cause the formation of undesirable chemical species at the oxide/metal interface, resulting in poor adhesion between the oxide and the metal. Deposition of a silicon-rich liner on the metal prior to depositing the doped silicon oxide layer acts to prevent dopant diffusion. Including the barrier layer has the beneficial effect of improving adhesion in the structure.

It is almost routine now in many applications to deposit barrier layers when forming certain structures. For example, a silicon-rich oxide liner is commonly formed on a substrate prior to deposition of a layer of fluorine-doped silicon oxide in fluorosilicate-glass ("FSG") applications using HDP-CVD. Although this has numerous advantages over comparable applications that do not use a silicon-rich oxide liner, significant variation is still seen in the composition of the liner so that its beneficial effects are not uniformly available. Furthermore, this composition variation has specific characteristics peculiar to individual deposition chambers. Mass production of integrated circuits would be improved with a technique that produces improved composition uniformity, without affecting the vagaries of individual deposition chamber configurations.

SUMMARY OF THE INVENTION

Embodiments of the invention are directed to a method and system for forming a layer on a substrate in a process chamber. Deposition gases are provided to the process chamber and permitted to mix in the desired relative concentrations prior to the deposition step, resulting in improved composition uniformity of the layer. In certain embodiments, two distinct plasmas are used, a first to heat the substrate and a second that is used for the actual deposition.

Thus, in various embodiments, a first gaseous mixture is provided to a process chamber. A first plasma is generated from the first gaseous mixture to heat the substrate. The plasma is then terminated and a second gaseous mixture is provided to the process chamber such that the second gaseous mixture is substantially uniformly mixed. A second plasma is then generated from the second gaseous mixture to deposit the layer on the substrate. In certain embodiments, the first gaseous mixture consists of oxygen or comprises both oxygen and argon. To deposit a silicon-rich oxide layer, the second gaseous mixture may comprise oxygen and silane. In one embodiment the concentration ratio between the oxygen and silane is between 0.5 and 1.5. In another embodiment, the second plasma is a high-density plasma and may be generated by initiating a low-pressure strike of the second gaseous mixture.

The methods of the present invention may be embodied in a computer-readable storage medium having a computer-readable program embodied therein for directing operation of a substrate processing system. Such a system may include a process chamber, a plasma generation system, a substrate holder, a gas delivery system, and a system controller. The computer-readable program includes instructions for operating the substrate processing system to form a thin film on a substrate disposed in the processing chamber in accordance with the embodiments described above.

A further understanding of the nature and advantages of the present invention may be realized by reference to the remaining portions of the specification and the drawings.

DESCRIPTION OF THE SPECIFIC EMBODIMENTS

I. Introduction

Embodiments of the present invention are directed to a method and apparatus for improving the uniformity of layers deposited on a substrate. In particular, the method and apparatus achieve increased consistency in layer uniformity as a result of a premixing step, for example of oxygen and silane in depositing a silicon-rich liner. The technique achieves improved control of the composition of the liner, allowing better composition uniformity across layer thickness and reduced variation in silicon-rich oxide layer properties among different chambers. No structural changes to existing deposition hardware systems, such as HDP-CVD deposition systems, are needed to take advantage of the technique.

II. Exemplary Substrate Processing System

Figure 1A:
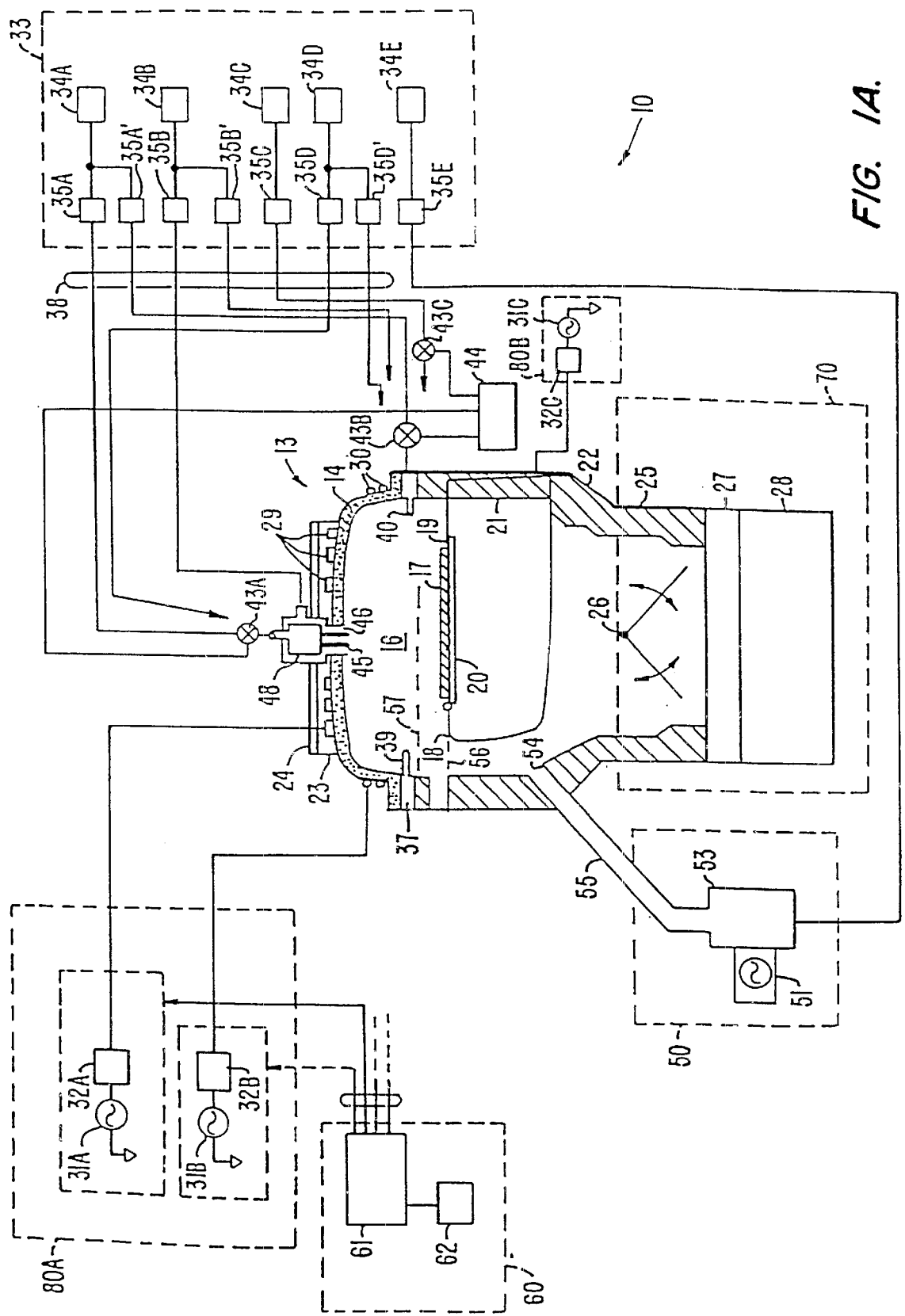
FIG. 1A is a simplified diagram of one embodiment of a high-density plasma chemical vapor deposition system according to the present invention.

FIG. 1A illustrates one embodiment of a high density plasma chemical vapor deposition (HDP-CVD) system 10 in which a dielectric layer according to the present invention can be deposited. System 10 includes a chamber 13, a vacuum system 70, a source plasma system 80A, a bias plasma system 80B, a gas delivery system 33, and a remote plasma cleaning system 50.

The upper portion of chamber 13 includes a dome 14, which is made of a ceramic dielectric material, such as aluminum oxide or aluminum nitride. Dome 14 defines an upper boundary of a plasma processing region 16. Plasma processing region 16 is bounded on the bottom by the upper surface of a substrate 17 and a substrate support member 18.

A heater plate 23 and a cold plate 24 surmount, and are thermally coupled to, dome 14. Heater plate 23 and cold plate 24 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 13 includes a body member 22, which joins the chamber to the vacuum system. A base portion 21 of substrate support member 18 is mounted on, and forms a continuous inner surface with, body member 22. Substrates are transferred into and out of chamber 13 by a robot blade (not shown) through an insertion/removal opening (not shown) in the side of chamber 13. Lift pins (not shown) are raised and then lowered under the control of a motor (also not shown) to move the substrate from the robot blade at an upper loading position 57 to a lower processing position 56 in which the substrate is placed on a substrate receiving portion 19 of substrate support member 18. Substrate receiving portion 19 includes an electrostatic chunk 20 that secures the substrate to substrate support member 18 during substrate processing. In a preferred embodiment, substrate support member 18 is made from an aluminum oxide or aluminum ceramic material.

Vacuum system 70 includes throttle body 25, which houses twin-blade throttle valve 26 and is attached to gate valve 27 and turbo-molecular pump 28. It should be noted that throttle body 25 offers minimum obstruction to gas flow, and allows symmetric pumping. Gate valve 27 can isolate pump 28 from throttle body 25, and can also control chamber pressure by restricting the exhaust flow capacity when throttle valve 26 is fully open. The arrangement of the throttle valve, gate valve, and turbo-molecular pump allow accurate and stable control of chamber pressures from between about 1 millitorr to about 2 torr.

The source plasma system 80A includes a top coil 29 and side coil 30, mounted on dome 14. A symmetrical ground shield (not shown) reduces electrical coupling between the coils. Top coil 29 is powered by top source RF (SRF) generator 31A, whereas side coil 30 is powered by side SRF generator 31B, allowing independent power levels and frequencies of operation for each coil. This dual coil system allows control of the radial ion density in chamber 13, thereby improving plasma uniformity. Side coil 30 and top coil 29 are typically inductively driven, which does not require a complimentary electrode. In a specific embodiment, the top source RF generator 31A provides up to 5,000 watts of RF power at nominally 2 MHz and the side source RF generator 31B provides up to 5,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 80B includes a bias RF ("BRF") generator 31C and a bias matching network 32C. The bias plasma system 80B capacitively couples substrate portion 17 to body member 22, which act as complimentary electrodes. The bias plasma system 80B serves to enhance the transport of plasma species (e.g., ions) created by the source plasma system 80A to the surface of the substrate. In a specific embodiment, bias RF generator provides up to 5,000 watts of RF power at 13.56 MHz.

RF generators 31A and 31B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 32A and 32B match the output impedance of generators 31A and 31B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 1B:
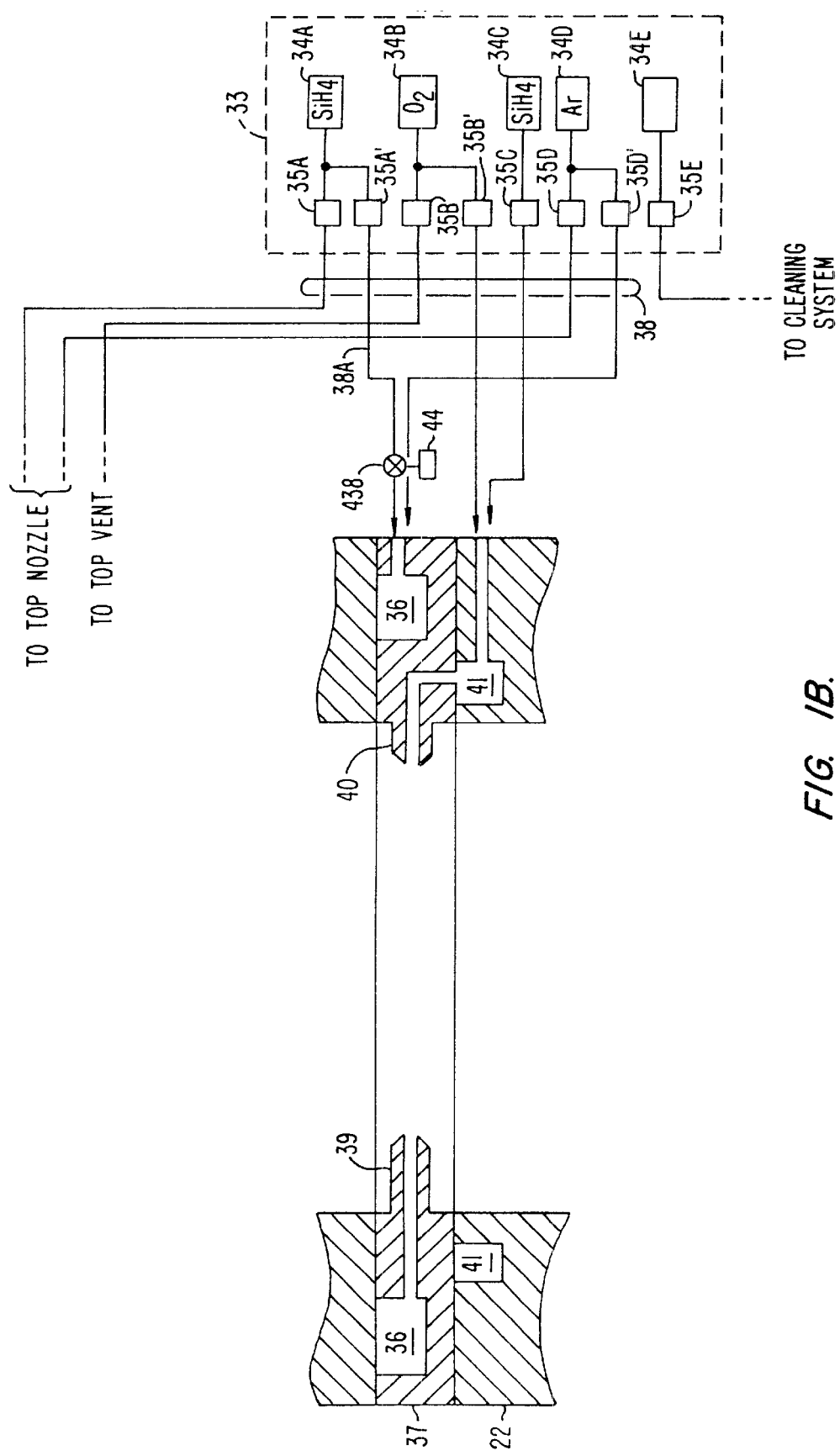
FIG. 1B is a simplified cross section of a gas ring that may be used in conjunction with the exemplary CVD processing chamber of FIG. 1A.

A gas delivery system 33 provides gases from several sources, 34A–34F chamber for processing the substrate via gas delivery lines 38 (only some of which are shown). As would be understood by a person of skill in the art, the actual sources used for sources 34A–34F and the actual connection of delivery lines 38 to chamber 13 varies depending on the deposition and cleaning processes executed within chamber 13. Gases are introduced into chamber 13 through a gas ring 37 and/or a top nozzle 45. FIG. 1B is a simplified, partial cross-sectional view of chamber 13 showing additional details of gas ring 37.

In one embodiment, first and second gas sources, 34A and 34B, and first and second gas flow controllers, 35A' and 35B', provide gas to ring plenum 36 in gas ring 37 via gas delivery lines 38 (only some of which are shown). Gas ring 37 has a plurality of source gas nozzles 39 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 37 has 12 source gas nozzles made from an aluminum oxide ceramic.

Gas ring 37 also has a plurality of oxidizer gas nozzles 40 (only one of which is shown), which in a preferred embodiment are co-planar with and shorter than source gas nozzles 39, and in one embodiment receive gas from body plenum 41. In some embodiments it is desirable not to mix source gases and oxidizer gases before injecting the gases into chamber 13. In other embodiments, oxidizer gas and source gas may be mixed prior to injecting the gases into chamber 13 by providing apertures (not shown) between body plenum 41 and gas ring plenum 36. In one embodiment, third and fourth gas sources, 34C and 34D, and third and fourth gas flow controllers, 35C and 35D', provide gas to body plenum via gas delivery lines 38. Additional valves, such as 43B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 43B, to isolate chamber 13 from delivery line 38A and to vent delivery line 38A to vacuum foreline 44, for example. As shown in FIG. 1A, other similar valves, such as 43A and 43C, may be incorporated on other gas delivery lines. Such 3-way valves may be placed as close to chamber 13 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 1A, chamber 13 also has top nozzle 45 and top vent 46. Top nozzle 45 and top vent 46 allow independent control of top and side flows of the gases, which improves layer uniformity and allows fine adjustment of the layer's deposition and doping parameters. Top vent 46 is an annular opening around top nozzle 45. In one embodiment, first gas source 34A supplies source gas nozzles 39 and top nozzle 45. Source nozzle MFC 35A' controls the amount of gas delivered to source gas nozzles 39 and top nozzle MFC 35A controls the amount of gas delivered to top gas nozzle 45. Similarly, two MFCs 35B and 35B' may be used to control the flow of oxygen to both top vent 46 and oxidizer gas nozzles 40 from a single source of oxygen, such as source 34B. The gases supplied to top nozzle 45 and top vent 46 may be kept separate prior to flowing the gases into chamber 13, or the gases may be mixed in top plenum 48 before they flow into chamber 13. Separate sources of the same gas may be used to supply various portions of the chamber.

A remote microwave-generated plasma cleaning system 50 is provided to periodically clean deposition residues from chamber components. The cleaning system includes a remote microwave generator 51 that creates a plasma from a cleaning gas source 34E (e.g., molecular fluorine, nitrogen trifluoride, other fluorocarbons or equivalents) in reactor cavity 53. The reactive species resulting from this plasma are conveyed to chamber 13 through cleaning gas feed port 54 via applicator tube 55. The materials used to contain the cleaning plasma (e.g., cavity 53 and applicator tube 55) must be resistant to attack by the plasma. The distance between reactor cavity 53 and feed port 54 should be kept as short as practical, since the concentration of desirable plasma species may decline with distance from reactor cavity 53. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 20, do not need to be covered with a dummy wafer or otherwise protected, as may be required with an in situ plasma cleaning process. In one embodiment, this cleaning system is used to dissociate atoms of the etchant gas remotely, which are then supplied to the process chamber 13. In another embodiment, the etchant gas is provided directly to the process chamber 13. In still a further embodiment, multiple process chambers are used, with deposition and etching steps being performed in separate chambers.

System controller 60 controls the operation of system 10. In a preferred embodiment, controller 60 includes a memory 62, such as a hard disk drive, a floppy disk drive (not shown), and a card rack (not shown) coupled to a processor 61. The card rack may contain a single-board computer (SBC) (not shown), analog and digital input/output boards (not shown), interface boards (not shown), and stepper motor controller boards (not shown). The system controller conforms to the Versa Modular European ("VME") standard, which defines board, card cage, and connector dimensions and types. The VME standard also defines the bus structure as having a 16-bit data bus and 24-bit address bus. System controller 31 operates under the control of a computer program stored on the hard disk drive or through other computer programs, such as programs stored on a removable disk. The computer program dictates, for example, the timing, mixture of gases, RF power levels and other parameters of a particular process. The interface between a user and the system controller is via a monitor, such as a cathode ray tube ("CRT") 65, and a light pen 66, as depicted in FIG. 1C.

Figure 1C:
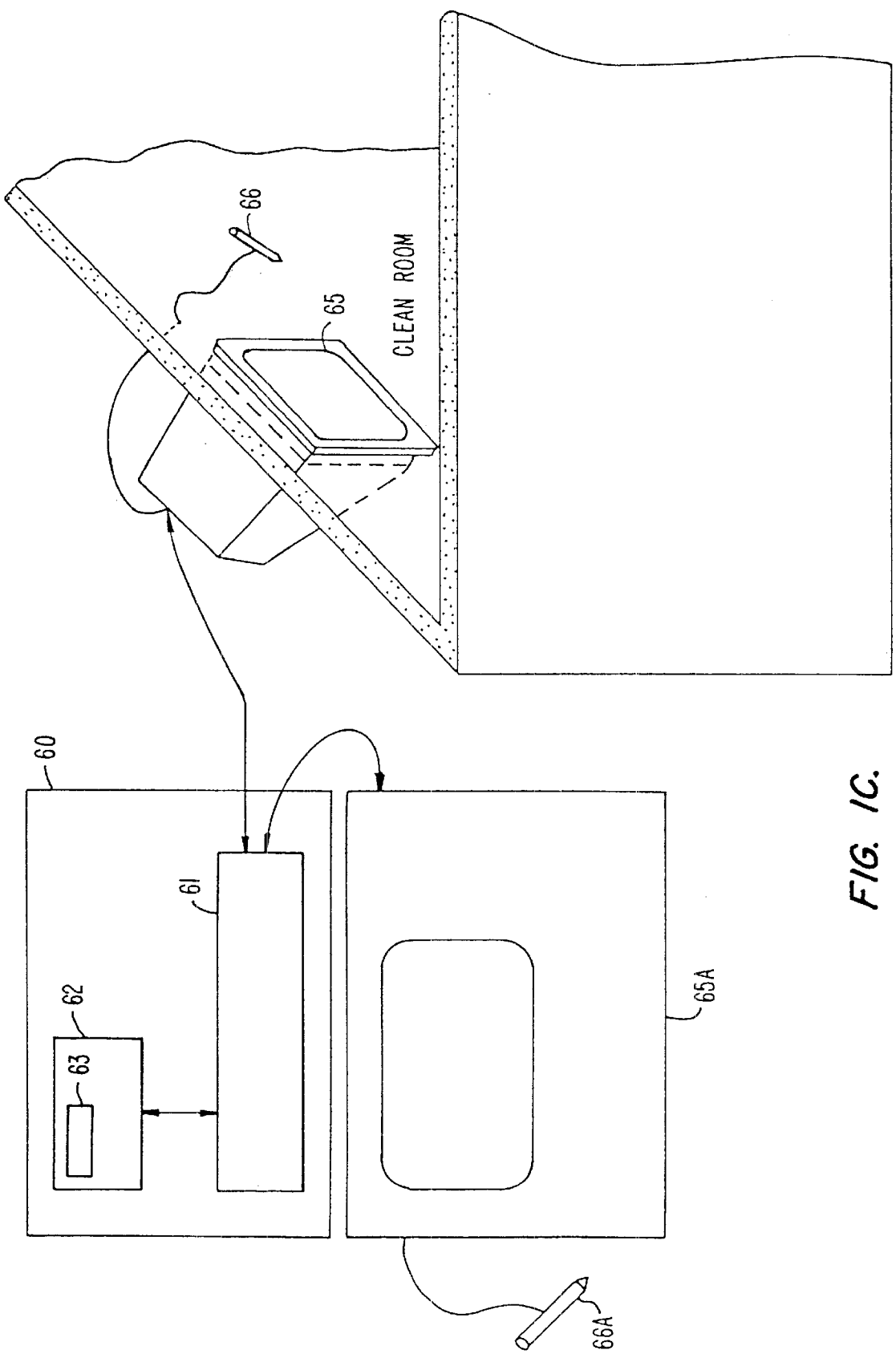
FIG. 1C is a simplified diagram of a monitor and light pen that may be used in conjunction with the exemplary CVD processing chamber of FIG. 1A.

FIG. 1C is an illustration of a portion of an exemplary system user interface used in conjunction with the exemplary CVD processing chamber of FIG. 1A. System controller 60 includes a processor 61 coupled to a computer-readable memory 62. Preferably, memory 62 may be a hard disk drive, but memory 62 may be other kinds of memory, such as ROM, PROM, and others.

System controller 60 operates under the control of a computer program 63 stored in a computer-readable format within memory 62. The computer program dictates the timing, temperatures, gas flows, RF power levels and other parameters of a particular process. The interface between a user and the system controller is via a CRT monitor 65 and a light pen 66, as depicted in FIG. 1C. In a preferred embodiment, two monitors, 65 and 65A, and two light pens, 66 and 66A, are used, one mounted in the clean room wall (65) for the operators and the other behind the wall (65A) for the service technicians. Both monitors simultaneously display the same information, but only one light pen (e.g. 66) is enabled. To select a particular screen or function, the operator touches an area of the display screen and pushes a button (not shown) on the pen. The touched area confirms being selected by the light pen by changing its color or displaying a new menu, for example.

The computer program code can be written in any conventional computer-readable programming language such as 68000 assembly language, C, C++, or Pascal. Suitable program code is entered into a single file, or multiple files, using a conventional text editor and is stored or embodied in a computer-usable medium, such as a memory system of the computer. If the entered code text is in a high level language, the code is compiled, and the resultant compiler code is then linked with an object code of precompiled windows library routines. To execute the linked compiled object code, the system user invokes the object code causing the computer system to load the code in memory. The CPU reads the code from memory and executes the code to perform the tasks identified in the program.

Figure 1D:
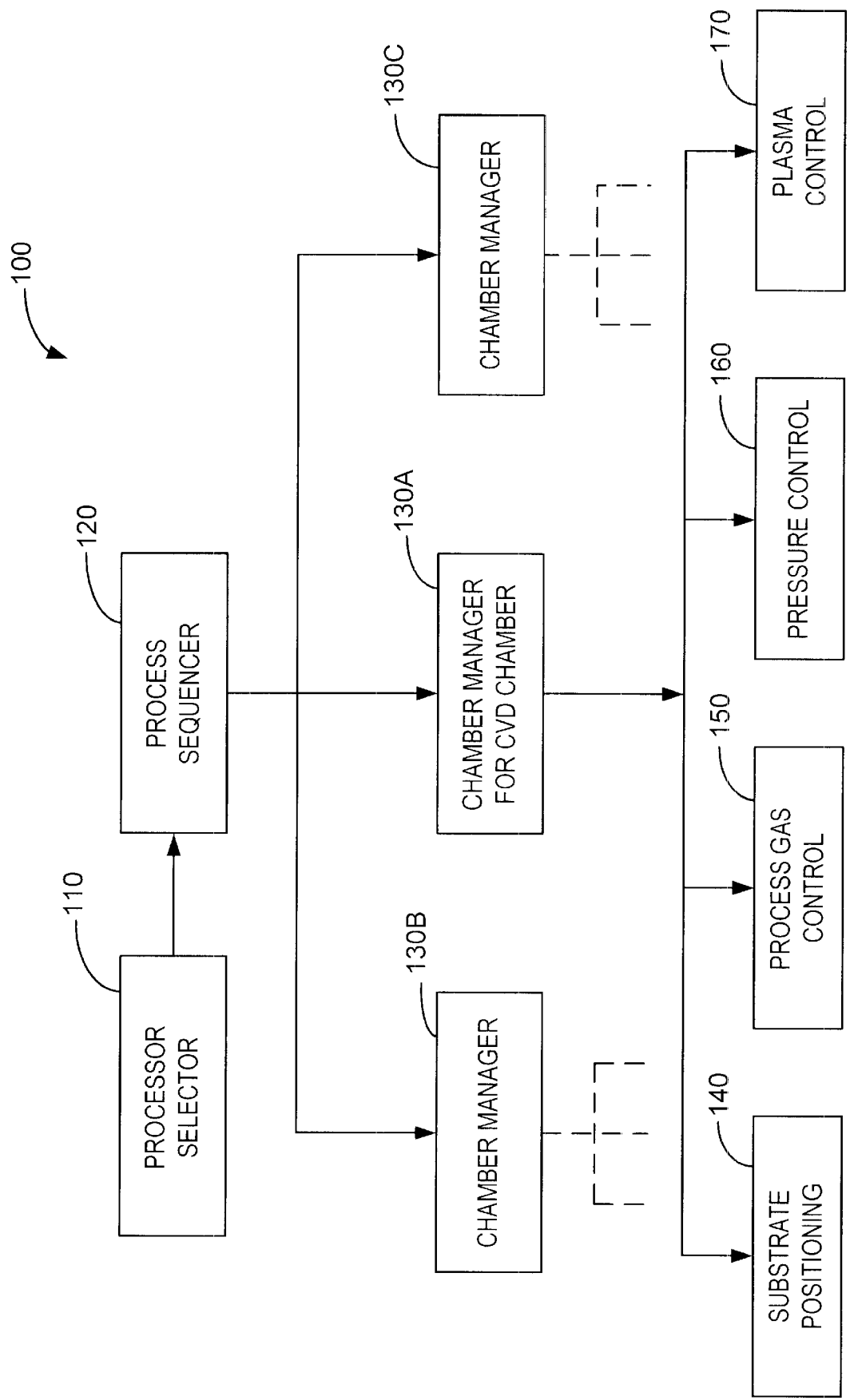
FIG. 1D is a flow chart of an exemplary process control computer program product used to control the exemplary CVD processing chamber of FIG. 1A.

FIG. 1D shows an illustrative block diagram of the hierarchical control structure of computer program 100. A user enters a process set number and process chamber number into a process selector subroutine 110 in response to menus or screens displayed on the CRT monitor by using the light pen interface. The process sets are predetermined sets of process parameters necessary to carry out specified processes, and are identified by predefined set numbers. Process selector subroutine 110 identifies (i) the desired process chamber in a multichamber system, and (ii) the desired set of process parameters needed to operate the process chamber for performing the desired process. The process parameters for performing a specific process relate to conditions such as process gas composition and flow rates, temperature, pressure, plasma conditions such as RF power levels, and chamber dome temperature, and are provided to the user in the form of a recipe. The parameters specified by the recipe are entered utilizing the light pen/ CRT monitor interface.

The signals for monitoring the process are provided by the analog and digital input boards of system controller 60, and the signals for controlling the process are output on the analog and digital output boards of system controller 60.

A process sequencer subroutine 120 comprises program code for accepting the identified process chamber and set of process parameters from the process selector subroutine 110 and for controlling operation of the various process chambers. Multiple users can enter process set numbers and process chamber numbers, or a single user can enter multiple process set numbers and process chamber numbers; sequencer subroutine 120 schedules the selected processes in the desired sequence. Preferably, sequencer subroutine 120 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 120 can be designed to take into consideration the "age" of each particular user-entered request, or the present condition of the process chamber being used in comparison with the desired process conditions for a selected process, or any other relevant factor a system programmer desires to include for determining scheduling priorities.

After sequencer subroutine 120 determines which process chamber and process set combination is going to be executed next, sequencer subroutine 120 initiates execution of the process set by passing the particular process set parameters to a chamber manager subroutine 130A–C, which controls multiple processing tasks in chamber 13 and possibly other chambers (not shown) according to the process set sent by sequencer subroutine 120.

Examples of chamber component subroutines are substrate positioning subroutine 140, process gas control subroutine 150, pressure control subroutine 160, and plasma control subroutine 170. Those having ordinary skill in the art will recognize that other chamber control subroutines can be included depending on what processes are selected to be performed in chamber 13. In operation, chamber manager subroutine 130A selectively schedules or calls the process component subroutines in accordance with the particular process set being executed. Chamber manager subroutine 130A schedules process component subroutines in the same manner that sequencer subroutine 120 schedules the process chamber and process set to execute. Typically, chamber manager subroutine 130A includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIGS. 1A and 1D. Substrate positioning subroutine 140 comprises program code for controlling chamber components that are used to load a substrate onto substrate support number 18. Substrate positioning subroutine 140 may also control transfer of a substrate into chamber 13 from, e.g., a plasma-enhanced CVD ("PECVD") reactor or other reactor in the multichamber system, after other processing has been completed.

Process gas control subroutine 150 has program code for controlling process gas composition and flow rates. Subroutine 150 controls the open/close position of the safety shut-off valves and also ramps up/ramps down the mass flow controllers to obtain the desired gas flow rates. All chamber component subroutines, including process gas control subroutine 150, are invoked by chamber manager subroutine 130A. Subroutine 150 receives process parameters from chamber manager subroutine 130A related to the desired gas flow rates.

Typically, process gas control subroutine 150 opens the gas supply lines, and repeatedly (i) reads the necessary mass flow controllers, (ii) compares the readings to the desired flow rates received from chamber manager subroutine 130A, and (iii) adjusts the flow rates of the gas supply lines as necessary. Furthermore, process gas control subroutine 150 may include steps for monitoring the gas flow rates for unsafe rates and for activating the safety shut-off valves when an unsafe condition is detected.

In some processes, an inert gas, such as argon, is flowed into chamber 13 to stabilize the pressure in the chamber before reactive process gases are introduced. For these processes, the process gas control subroutine 150 is programmed to include steps for flowing the inert gas into chamber 13 for an amount of time necessary to stabilize the pressure in the chamber. The steps described above may then be carried out.

Additionally, when a process gas is to be vaporized from a liquid precursor, for example, tetraethylorthosilane (TEOS), the process gas control subroutine 150 may include steps for bubbling a delivery gas such as helium through the liquid precursor in a bubbler assembly or for introducing the helium to a liquid injection valve. For this type of process, the process gas control subroutine 150 regulates the flow of the delivery gas, the pressure in the bubbler, and the bubbler temperature to obtain the desired process gas flow rates. As discussed above, the desired process gas flow rates are transferred to process gas control subroutine 150 as process parameters.

Furthermore, the process gas control subroutine 150 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The process gas control subroutine 150 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 160 includes program code for controlling the pressure in chamber 13 by regulating the size of the opening of throttle valve 26 in the exhaust portion of the chamber. There are at least two basic methods of controlling the chamber with the throttle valve. The first method relies on characterizing the chamber pressure as it relates to, among other things, the total process gas flow, the size of the process chamber, and the pumping capacity. The first method sets throttle valve 26 to a fixed position. Setting throttle valve 26 to a fixed position may eventually result in a steady-state pressure.

Alternatively, the chamber pressure may be measured, with a manometer for example, and the position of throttle valve 26 may be adjusted according to pressure control subroutine 360, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 160 is invoked, the desired, or target, pressure level is received as a parameter from chamber manager subroutine 130A. Pressure control subroutine 160 measures the pressure in chamber 13 by reading one or more conventional pressure manometers connected to the chamber; compares the measured value(s) to the target pressure; obtains proportional, integral, and differential (PID) values from a stored pressure table corresponding to the target pressure, and adjusts throttle valve 26 according to the PID values obtained from the pressure table. Alternatively, pressure control subroutine 160 may open or close throttle valve 26 to a particular opening size to regulate the pressure in chamber 13 to a desired pressure or pressure range.

Plasma control subroutine 170 comprises program code for controlling the frequency and power output setting of RF generators 31A and 31B and for tuning matching networks 32A and 32B. Plasma control subroutine 370, like the previously described chamber component subroutines, is invoked by chamber manager subroutine 330A.

An example of a system that may incorporate some or all of the subsystems and routines described above would be the ULTIMA™ system, manufactured by APPLIED MATERIALS, INC., of Santa Clara, Calif., configured to practice the present invention. Further details of such a system are disclosed in the copending, commonly assigned U.S. patent application Ser. No. 08/679,927, filed Jul. 15, 1996, entitled "Symmetric Tunable Inductively-Coupled HDP-CVD Reactor," having Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha listed as co-inventors, the disclosure of which is incorporated herein by reference. The described system is for exemplary purpose only. It would be a matter of routine skill for a person of skill in the art to select an appropriate conventional substrate processing system and computer control system to implement the present invention.

III. Precursor Gas Mixing

While the invention finds a wide variety of uses in deposition procedures, its advantages may usefully be illustrated with the exemplary application of depositing a silicon-rich liner, such as may be used to prevent diffusion in IMD applications. A typical process that has previously been used for depositing such a liner consists of: (1) heating a substrate with a plasma; (2) then flowing liner precursor deposition gases to the plasma; and (3) then finally switching to deposition conditions to deposit the liner on the substrate. For example, one such process heats the substrate with an oxygen plasma (or alternatively an oxygen-argon plasma) to the desired temperature. A silane (perhaps also with a fluorine-containing gas such as $SiF_4$) is then flowed to the plasma to achieve silicon-rich oxide deposition. Significant variation in layer composition results from the fact that such a process necessarily imposes transient conditions on the deposition process.

Two principal methods are used to quantify the uniformity of the deposited layers. First, the refractive index, which may be measured with standard interference and ellipsometry techniques, is a useful measure of layer uniformity because it is a parameter that changes with layer composition, specifically increasing with silicon concentration. Variation in the value of the refractive index is thus a direct indication of layer nonuniformity. For example, pure silicon has a refractive index of 1.58 and a pure oxide such as $SiO_2$ has a refractive index of 1.46. A silicon-rich oxide liner used in IMD applications having an optimal refractive index of 1.51 achieves good adhesion with the underlying substrate and acts effectively to prevent undesirable diffusion. While variation in the refractive index over the layer is preferably kept as small as possible to retain optimized liner properties, deviations of 0.02 in either direction from this value still provide a liner with acceptable characteristics for current applications. The refractive index for a liner produced by the method outlined above typically has somewhat greater nonuniformity, varying between about 1.48 and 1.54.

Figure 2A:
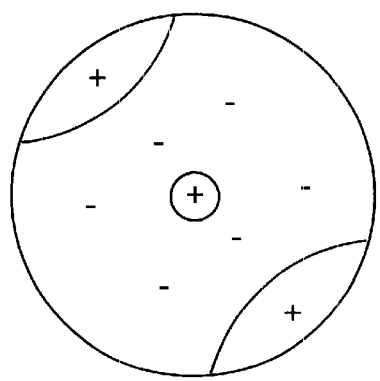
FIG. 2 is a schematic illustration of composition nonuniformities of layers deposited (a) without and (b) with a premixing step.

A second quantitative measure of layer uniformity is determined by calculating a one-σ standard deviation of a plurality of measurements over the deposited layer. Although other numbers of measurements may be made, one typical uniformity calculation is based on a 49-point assessment of the layer. For the liner-deposition process described above, the non-uniformity typically falls in a range from 5% to greater than 10%. The variation over a typical circular wafer is shown topographically in FIG. 2(a), with a "+" denoting areas of the liner that are silicon-rich and a "−" denoting areas of the wafer that are silicon-poor. The absence of circular symmetry in this non-uniformity pattern is a direct consequence of the transient character of the deposition procedure used. In fact, the pattern reflects the deposition characteristics of the process-chamber structure, showing silicon-rich regions specifically concentrated in locations defined by top and side gas flows.

Figure 2B:
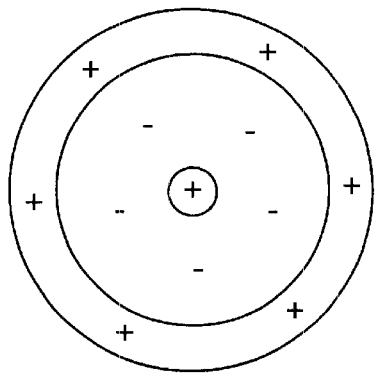

An approximately circularly symmetric distribution, such as the one shown topographically in FIG. 2(b), with considerably less variation in layer composition, is achieved in accordance with embodiments of the invention by providing an appropriate ratio of oxygen to silane in the process chamber 13 prior to deposition of the layer. This is achieved in one embodiment with a premixing step. Thus, in one such embodiment, a silicon-rich oxide liner is deposited by: (1) heating the substrate with a plasma; (2) terminating the plasma; (3) premixing the liner precursor gases in the process chamber 13 under nonplasma conditions; (4) striking a plasma with the liner precursor gases; and (5) switching to deposition conditions to deposit the liner. The heating plasma may be an oxygen, oxygen-argon, or argon plasma. The appropriate temperature for the substrate will depend on the application, but may be approximately 400° C. for certain IMD applications. The liner precursor gases may include oxygen and a silane, and perhaps also a fluorine-containing gas such as $SiF_4$. Striking of the plasma after the premixing step may proceed by a low-pressure strike such as described in the copending, commonly assigned U.S. patent application Ser. No. 09/470,819, filed Dec. 23, 1999, entitled "LOW PRESSURE STRIKE IN HDP-CVD CHAMBER," having Kasra Khazeni, Michael Cox, Michael Barnes, and Huong Thanh Nguyen listed as co-inventors, the disclosure of which is incorporated herein by reference. Use of such a low-pressure strike avoids plasma instability during the plasma stage ignition period, which might otherwise contribute to inconsistent film quality.

Figure 3:
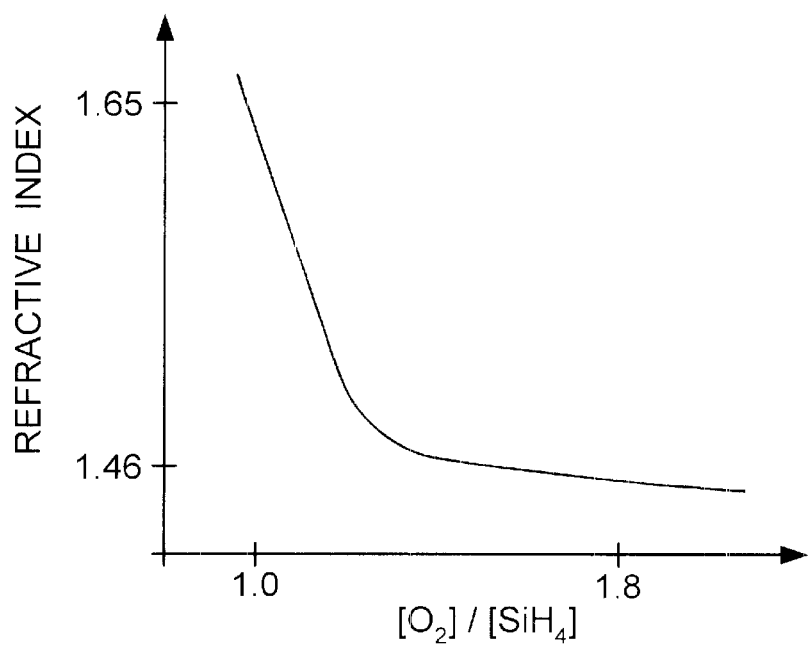
FIG. 3 is a graphical representation of the dependence of the refractive index of an oxide liner on the relative precursor concentration of oxygen to silane.

As explained, optimal liner characteristics are achieved for a narrowly constrained composition, defined by a narrow value for the refractive index. Moreover, the composition (and hence refractive index) is itself very sensitive to the ratio of concentrations of precursor gases, i.e., oxygen and silane, present in the process chamber 13. This is depicted in terms of the dependence of the refractive index on this ratio in FIG. 3. In practice, prior methods that did not include the premixing step were influenced by such mundane factors as the lengths of delivery lines 38 since variation in these lengths may cause different gases to arrive at the process chamber at different times. Adding a premixing step in the absence of a plasma allows sufficient time for the precursor reactant species to mix (close to uniformly) in the process chamber 13 before deposition starts. By controlling the appropriate ratio of oxygen to silane concentrations not only in the main deposition step, but also in the steps prior to the main deposition step, a more uniform layer composition is achieved. As a result, individual deposited silicon-rich oxide layers exhibit improved properties and there is also a considerable increase in consistency between chambers since composition artifacts from individual chamber designs are eliminated.

The method was tested by depositing a silicon-rich oxide liner on bare silicon wafers with an APPLIED MATERIALS, INC. ULTIMA™ system. In this test, oxygen, silane, and argon were used as reactants, with the wafer initially being brought to temperature with a high-density oxygen-argon plasma. A nominal refractive index of 1.51 was achieved with an oxygen-to-silane concentration ratio in the range of 0.5–1.5, adjusting reactant flow in the premix step itself to achieve a uniform distribution of the oxygen and silane, at this ratio, within the reactor volume. This uniform distribution was maintained through the low-pressure plasma strike by maintaining an appropriate oxygen/silane ratio. The resulting layer had a refractive index between 1.505 and 1.515 and a 49-point uniformity measurement of approximately 2.0%. These measures both indicate that layer uniformity is significantly improved as a result of the premixing step.

Figure 4:
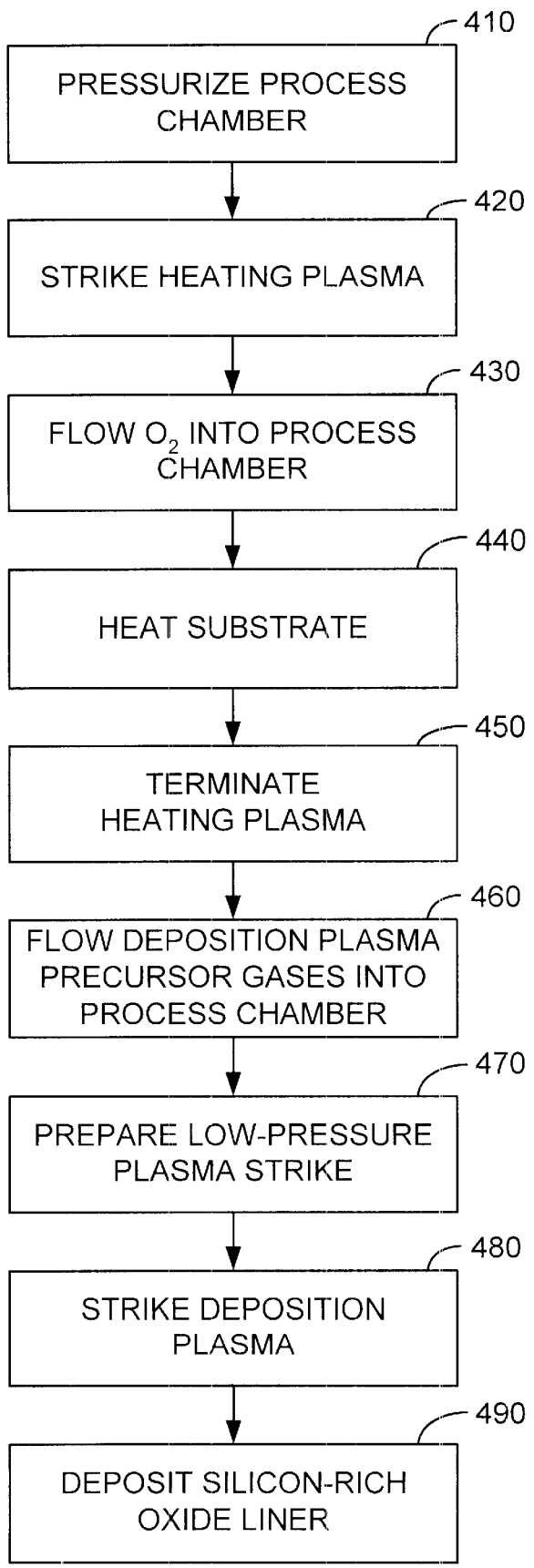
FIG. 4 is a flowchart of a recipe for depositing a silicon-rich oxide liner in accordance with one embodiment of the invention.

One exemplary recipe that incorporates these aspects of the invention and produces these results is summarized in FIG. 4 and Table I, which both show the principal steps involved in depositing a silicon-rich oxide liner according to an embodiment of the invention. The "Step" reference numbers in Table I correspond to those labels in the flow diagram of FIG. 4.

TABLE I

Exemplary Recipe for Silicon-Rich Oxide Liner Deposition

| Step | Time [s] | RF Power [W] | Bias RF [W] | F($O_2$) [sccm] | F(Ar) [sccm] | F($SiH_4$) [sccm] |
|---|---|---|---|---|---|---|
| 410 | 10.0 | 0 + 0 | 0 | 0 | 110 + 16 | 0 |
| 420 | 1.0 | 0 + 1000 | 0 | 0 | 110 + 16 | 0 |
| 430 | 1.0 | 2000 + 1000 | 0 | 35 | 110 + 16 | 0 |
| 440 | 65.0 | 2500 + 1500 | 0 | 126 | 110 + 16 | 0 |
| 450 | 1.0 | 0 + 0 | 0 | 126 | 110 + 16 | 0 |
| 460 | 8.0 | 0 + 1 | 0 | 75 | 110 + 16 | 60 + 15 |
| 470 | 0.3 | 0 + 1 | 300 | 45 | 40 + 5 | 35 + 3.9 |
| 480 | 0.3 | 0 + 1500 | 300 | 45 | 40 + 5 | 35 + 3.9 |
| 490 | 10.0 | 2500 + 1500 | 0 | 45 | 40 + 5 | 35 + 3.9 |

In Table I, where two numbers appear for a flow rate, the first number represents the flow rate of gas through inlets in the side of the process chamber 13 and the second number represents the flow rate of gas through the inlets in the top of the process chamber 13. Similarly, the side and top RF power are indicated under the single heading "RF Power" in the form (top RF power)+(side RF power).

In the exemplary recipe, the substrate is loaded into the process chamber 13 through a vacuum-lock door onto the substrate support member 18. Once the substrate is properly positioned, an argon gas flow is established at step 410 to pressurize the process chamber at approximately 50 mtorr. The pressure is stabilized throughout the process by manipulating the throttle valve 26 with a stepper motor while the vacuum pump 28 pumps at a constant capacity. Once argon flow and pressure are established, the heating plasma is struck at step 420 by establishing a (top) RF source power of 1000 W. After the plasma has been struck, the source bias is adjusted and oxygen is flowed into the process chamber at step 430. Plasma heating conditions are maintained for a period of time sufficient to heat the substrate at step 440.

The heating plasma is terminated at step 450. Subsequently, deposition precursor gas flows are established at step 460. In the exemplary recipe, these gas flows include oxygen and silane for deposition of a silicon-rich oxide liner. The flows are maintained at step 460 for sufficient time for the gases to mix within the process chamber 13 before striking a plasma. A low-pressure plasma strike, such as described in application Ser. No. 09/470,819, is performed at steps 470 and 480 to produce the deposition plasma. After the deposition plasma has been struck, the source bias, RF bias, and gas flows are adjusted to the desired deposition conditions to deposit the liner.

During the deposition, RF energy is applied to the top coil 29 and the side coil 30 by SRF generators 31A and 31B to form an inductive plasma. SRF generators 31A and 31B continue to apply RF energy to the top and side coils throughout the process. SRF generators 31A and 31B are driven at a nominal frequency of about 2 MHz at about 4000 W. This power is split between the top coil 29, which may be driven at about 1.8 MHz, for example, and the side coil 30, which may be driven at about 2.1 MHz, for example. The top coil 29 may receive about 1500 W and the side coil 30 about 2500 W. The temperature during the deposition is generally greater than about 400° C.

Having described several embodiments, it will be recognized by those of skill in the art that various modifications, alternative constructions, and equivalents may be used without departing from the spirit of the invention. In particular, although an embodiment directed to deposition of a silicon-rich oxide layer has been described in detail for IMD applications, those of skill in the art will readily recognize its general applicability to various STI, PMD, and IMD deposition processes for both USG and FSG applications, among others. Accordingly, the above description should not be taken as limiting the scope of the invention, which is defined in the following claims.

What is claimed is:

1. A method for forming a layer on a substrate in a process chamber, the method comprising:
   (a) providing a first gaseous mixture to the process chamber;
   (b) generating a first plasma from the first gaseous mixture to heat the substrate;
   (c) terminating the first plasma;
   (d) providing precursor gases to the process chamber;
   (e) allowing the precursor gases to mix to form a second gaseous mixture that is substantially uniformly mixed; and
   (f) generating a second plasma from the second gaseous mixture to deposit the layer on the substrate.

2. The method according to claim 1 wherein the first gaseous mixture consists of oxygen.

3. The method according to claim 1 wherein the first gaseous mixture comprises oxygen and argon.

4. The method according to claim 1 wherein the first gaseous mixture consists of argon.

5. The method according to claim 1 wherein the precursor gases comprise oxygen and silane.

6. The method according to claim 5 wherein the precursor gases further comprise a fluorine-containing gas.

7. The method according to claim 5 wherein the oxygen and silane are provided with a concentration ratio between 0.5 and 1.5.

8. The method according to claim 1 wherein the second plasma is a high-density plasma.

9. The method according to claim 1 wherein the step of generating the second plasma comprises initiating a low-pressure strike of the second gaseous mixture.

10. The method according to claim 1 wherein the layer is a liner layer suitable for deposition of a second layer thereover.

11. A method for forming a layer on a substrate in a process chamber, the method comprising:
    (a) heating the substrate;
    (b) thereafter, substantially uniformly mixing precursor gases within the process chamber; and
    (c) thereafter, generating a plasma from the mixed precursor gases to deposit the layer on the substrate.

12. The method according to claim 11 wherein the plasma is a high-density plasma.

13. The method according to claim 11 wherein the step of generating the plasma comprises initiating a low-pressure strike of the mixed precursor gases.

14. A method for forming a layer on a substrate in a process chamber, the method comprising:
    (a) providing a first gaseous mixture to the process chamber;
    (b) generating a first plasma from the first gaseous mixture to heat the substrate;
    (c) terminating the first plasma;
    (d) providing precursor gases including oxygen and silane to the process chamber;
    (e) allowing the precursor gases to mix to form a second gaseous mixture is substantially uniformly mixed; and
    (f) generating a high-density plasma from the second gaseous mixture to deposit the layer on the substrate.

15. The method according to claim 14 wherein the oxygen and silane are provided with a concentration ratio between 0.5 and 1.5.

16. A computer-readable storage medium having a computer-readable program embodied therein for directing operation of a substrate processing system including a process chamber; a plasma generation system; a substrate holder; and a gas delivery system configured to introduce gases into the process chamber, the computer-readable program including instructions for operating the substrate processing system to form a layer on a substrate disposed in the processing chamber in accordance with the following:
    (a) providing a first gaseous mixture to the process chamber;
    (b) generating a first plasma from the first gaseous mixture to heat the substrate;
    (c) terminating the first plasma;
    (d) providing precursor gases to the process chamber;
    (e) allowing the precursor gases to mix to form a second gaseous mixture is substantially uniformly mixed; and
    (f) generating a second plasma from the second gaseous mixture to deposit the layer on the substrate.

17. The computer-readable storage medium according to claim 16 wherein the second plasma is a high-density plasma.

18. The computer-readable storage medium according to claim 16 wherein generating a second plasma comprises initiating a low-pressure strike of the second gaseous mixture.

19. A substrate processing system comprising:
(a) a housing defining a process chamber;
(b) a plasma generating system operatively coupled to the process chamber;
(c) a substrate holder configured to hold a substrate during substrate processing;
(d) a gas-delivery system configured to introduce gases into the process chamber;
(e) a pressure-control system for maintaining a selected pressure within the process chamber;
(f) a controller for controlling the plasma generating system, the gas-delivery system, and the pressure-control system; and
(g) a memory coupled to the controller, the memory comprising a computer-readable medium having a computer-readable program embodied therein for directing operation of the substrate processing system, the computer-readable program including
  (i) instructions to control the gas-delivery system to provide a first gaseous mixture to the process chamber;
  (ii) instructions to control the plasma generating system to generate a first plasma from the first gaseous mixture to heat the substrate;
  (iii) instructions to control the plasma generating system to terminate the first plasma;
  (iv) instructions to control the gas-delivery system to provide precursor gases to the process chamber; and
  (v) instructions to control the plasma generating system, after allowing the precursor gases to mix to form a substantially uniformly mixed second gaseous mixture, to generate a second plasma from the second gaseous mixture to deposit a layer on the substrate.

20. The substrate processing system according to claim 19 wherein the instructions to control the plasma generating system to generate a second plasma include instructions to generate a high-density plasma.

21. The substrate processing system according to claim 19 wherein the instructions to control the plasma generating system to generate a second plasma include instructions to initiate a low-pressure strike of the second gaseous mixture.

* * * * *